United States Patent [19]

Maccarrone et al.

[11] Patent Number: 5,519,656
[45] Date of Patent: May 21, 1996

[54] VOLTAGE REGULATOR FOR PROGRAMMING NON-VOLATILE AND ELECTRICALLY PROGRAMMABLE MEMORY CELLS

[75] Inventors: Marco Maccarrone, Palestro; Marco Olivo, Bergamo; Carla Golla, Sesto San Giovanni; Silvia Padoan, Rimini, all of Italy

[73] Assignee: SGS-Thomson Microelectronics S.r.l., Agrate Brianza, Italy

[21] Appl. No.: 366,259

[22] Filed: Dec. 29, 1994

[30] Foreign Application Priority Data

Dec. 31, 1993 [EP] European Pat. Off. ............. 93830545

[51] Int. Cl.[6] ......................................... G11C 7/00
[52] U.S. Cl. ............... 365/189.09; 365/189.01; 365/226; 327/362; 327/540; 327/541
[58] Field of Search ....................... 365/189.01, 189.09, 365/207, 226; 327/362, 540, 541

[56] References Cited

U.S. PATENT DOCUMENTS 4,804,865  2/1989  Clark, III ................... 307/297
5,006,974  4/1991  Kazerounian et al. .......... 365/185
5,097,303  3/1992  Taguchi ...................... 365/185
5,124,631  6/1992  Terashima .................. 365/189.09
5,291,446  3/1994  Van Biskirk et al. ......... 365/189.06
5,424,412  8/1995  Kowalski .................... 365/189.07

FOREIGN PATENT DOCUMENTS 0397408  11/1990  European Pat. Off. ......... G05F 3/24
0525679   2/1993  European Pat. Off. ........ G11C 11/41
0538121   4/1993  European Pat. Off. ........ G11C 16/06

Primary Examiner—Tan T. Nguyen
Attorney, Agent, or Firm—David M. Driscoll; James H. Morris

[57] ABSTRACT

A voltage regulator for programming non-volatile memory cells, which comprises an amplifier stage being powered between a first and a second voltage reference and having a first input terminal connected to a resistive divider of the first reference voltage and an output terminal fed back to said input through a current mirror, and a source-follower transistor controlled by the output and connected to the cells through a programming line. Also provided is a MOS transistor which connects to ground the programming line and a corresponding resistive path connected between the current mirror and the second voltage reference.

42 Claims, 3 Drawing Sheets

VOLTAGE REGULATOR FOR PROGRAMMING NON-VOLATILE AND ELECTRICALLY PROGRAMMABLE MEMORY CELLS

BACKGROUND OF THE INVENTION

1. Field of the Invention

This invention relates to a voltage regulator which allows the terminals of a memory cell to be suitably biased. More particularly, the invention is concerned with a voltage regulator for programming non-volatile memory cells.

2. Discussion of the Related Art

In a well-known manner, a non-volatile memory cell comprises a MOS transistor having a "floating" gate terminal, that is exhibiting a high DC impedance to all the other terminals of the cell and the circuit in which the cell is connected. The cell also has a second electrode, known as the control gate electrode, which is driven by appropriate control voltages. The other electrodes of the MOS transistor are the usual drain, source and body terminals.

By changing the value of the voltage applied to the control gate, the amount of the charge present in the floating gate can be changed. Thus, the transistor can be placed in either of two logic states: a first state with a "high" threshold voltage, and a second state with a "low" threshold voltage.

By applying a voltage in between these two values to the control gate, the state of the transistor can be "read", since the transistor will either present a low or a high impedance between its drain and source terminals according to the value of the threshold voltage. The transistor functions, therefore, as a logic storage element.

Furthermore, since the floating gate presents a high impedance to any other terminals of the cell, the charge stored in the transistor can be held for an indefinite length of time, even if the power supply to the circuit in which it is connected is removed. Thus, the cell has non-volatile memory characteristics.

The operation whereby charge is stored in the floating gate is referred to as the cell "programming", whereas the operation whereby said charge is removed from the floating gate is referred to as the cell "erasing".

A non-volatile memory circuit integrated to a semiconductor usually includes a very large number of such cells. The cells are laid in rows (word lines) and columns (bit lines). The cells in one row share the line which drives their respective control gates. The cells in the same bit line share the drain electrode. In order to program a given cell, the appropriate positive voltage values are impressed on the word line and the bit line that locate it.

A memory cell programming is strongly affected by the voltage applied to the drain terminal, that is the voltage VP present on the bit line to which it belongs.

Also known is that with non-volatile memory cells, in particular of the flash type, a reduced value of said drain voltage VP gives rise to insufficient and slow cell programming, whereas an excessively large value results in the cell being partially erased (the so-called "soft erasing" phenomenon). Thus, the optimum range for VP is fairly narrow, typically between about 5 and 6 V.

In view of the foregoing, the memory circuit should be provided with a particularly sophisticated and accurate voltage regulator to supply the bit line with the appropriate voltage during the programming step.

One of the methods employed to program memory cells utilizes the phenomenon of the injection of hot electrons through the gate oxide of the cell.

For the injection process to be triggered, it is necessary that the cell terminals be suitably polarized; the drain-source voltage should attain a value in the 5 to 6 volts range, in order to accelerate the electrons present in the channel, while the gate-source voltage should be a value of about 12 volts, so as to attract the accelerated electrons.

However, as previously mentioned, what is critical is the value of the drain voltage VP, and this should be held as stable as possible during the programming.

The fluctuations in said voltage are tied to the following factors:

technological changes in the manufacturing processes of the various components;

increased threshold voltage of the cell during the programming, and consequent decrease in current draw; and, voltage drops across the selection transistors present in the bit lines.

The last-mentioned is a significant effect especially with large capacity memories, wherein in view of the small dimensions involved, the selection transistors have a particularly small W/L (channel width to length) ratio and, therefore, high series resistance.

Thus, there evidently exists a need for a voltage regulator of sufficiently refined design to take account of all the factors involved. The prior art solves these problems by providing a circuit wherein the output voltage from the regulator exceeds that sought for the bit line by an appropriate amount which is continually dependent on the actual current flowing through the selection transistors in the bit line.

To accomplish this, a polarization technique of the adaptive type is employed which provides for a positive feedback structure.

An example of this prior approach is shown schematically in FIG. 1. In essence, a voltage generator generates a constant voltage (VPROG) equal to the voltage that should appear on the selected bit line if optimum programming conditions are to be provided. That voltage is added a varying voltage, designated Vcomp. The value Vcomp is obtained by mirroring the current supplied from the regulator to the bit line on elements which are mirror-images of the bit line selection transistors, thereby producing the same voltage drop across them.

More specifically, the regulated voltage is supplied from a source-follower MOS transistor, designated MOUT, which is driven by a suitably fed-back operational amplifier (4). This arrangement includes two feedback loops: a first loop inherent to the voltage regulator, and the second loop (comprising a MOS transistor, designated MPR2, and a generic block H) to compensate for the voltage drop at the bit line. The second loop supplies a current to a drop resistance Rdrop which is proportional to the current from the regulator, and hence, tied to that drawn by the cell being programed.

In a storage device, the programming usually takes place in parallel through all the cells of one word; of course, only those cells in which a voltage rise is to occur, i.e. which are to contain a logic "1", would be actually programed.

The current drawn from the bit line at the programming stage will depend, therefore, on the pattern of bits to be stored. To avoid altering the compensation, the drop resistance should be varied accordingly.

However, this prior approach has some drawbacks, as follows:

the bias current drawn by the MOS M9, shown in FIG. 1, is carried over to the drop resistance to cause an undesired constant component to appear in the compensation voltage Vcomp. This constant voltage component is particularly objectionable where a single cell is programmed, because in this case, the current drawn by the transistor M9 is then no longer negligible against that required for the programming; and while the cells are being read, the bit line is polarized to a voltage of about 1 V, and connected to the line VP via a p-channel MOS transistor. This transistor has its gate voltage Vg0=0 V (as impressed by a switch being also supplied VP) and its source voltage Vs0=1 V, and is therefore in conduction.

At the reading stage, the programming voltage VP is zero and the p-channel MOS transistor connects the capacitance associated with the junction of the conducting transistor MOUT to the bit line; as a result, the capacitance of the bit line is greatly increased and its reading speed greatly decreased. This is a baffling phenomenon in that it only comes out where the bit line takes a higher voltage than the p-channel threshold voltage; this may happen when the supply voltage exceeds its rated value. Accordingly, this phenomenon should be carefully suppressed.

It is one object of the present invention to provide a voltage regulator which can supply the voltage actually needed for proper programming, but also hold the programming line and bit line decoupled while the latter is being read.

SUMMARY OF THE INVENTION

In one illustrative embodiment of the invention, a voltage regulator is provided which comprises an amplifier stage controlled by a compensation voltage which is made independent of the voltage drop due to a resistive path connecting the programming line to the device ground reference.

In another embodiment of the invention, the regulator includes a structure which allows the reading speed of the cells in the bit line to be improved, while decoupling it from the programming line to thereby eliminate the above-outlined drawbacks.

BRIEF DESCRIPTION OF THE DRAWINGS

The features and advantages of a circuit according to the invention will be apparent from the following detailed description of an embodiment thereof, given by way of example and not of limitation with reference to the accompanying drawings.

DETAILED DESCRIPTION

Figure 1:
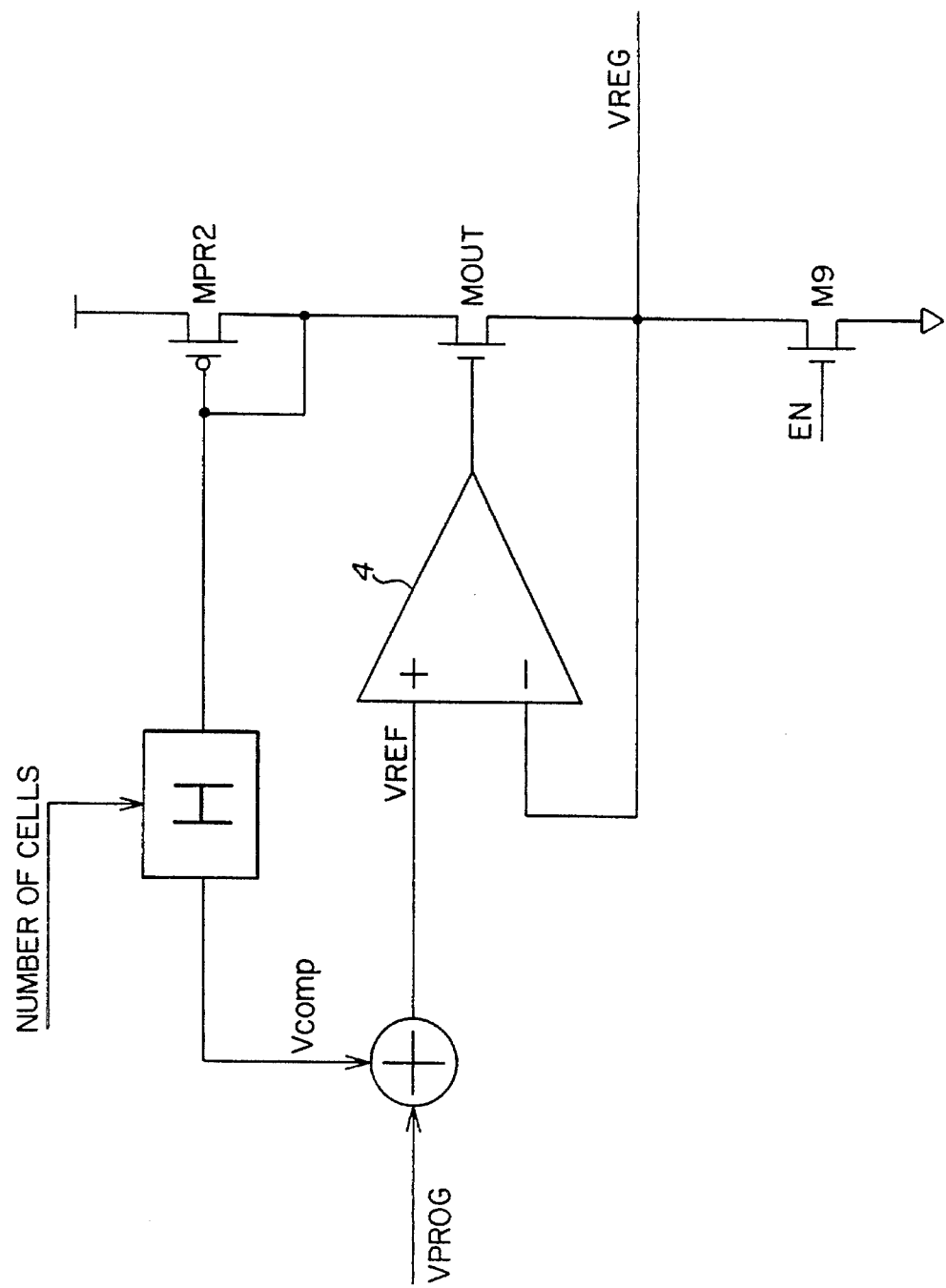
FIG. 1 is a diagram illustrating the principle which underlies a voltage regulator embodying the prior art.

FIG. 1 relates to an embodiment of a voltage regulator according to the prior art as previously discussed.

Figure 2:
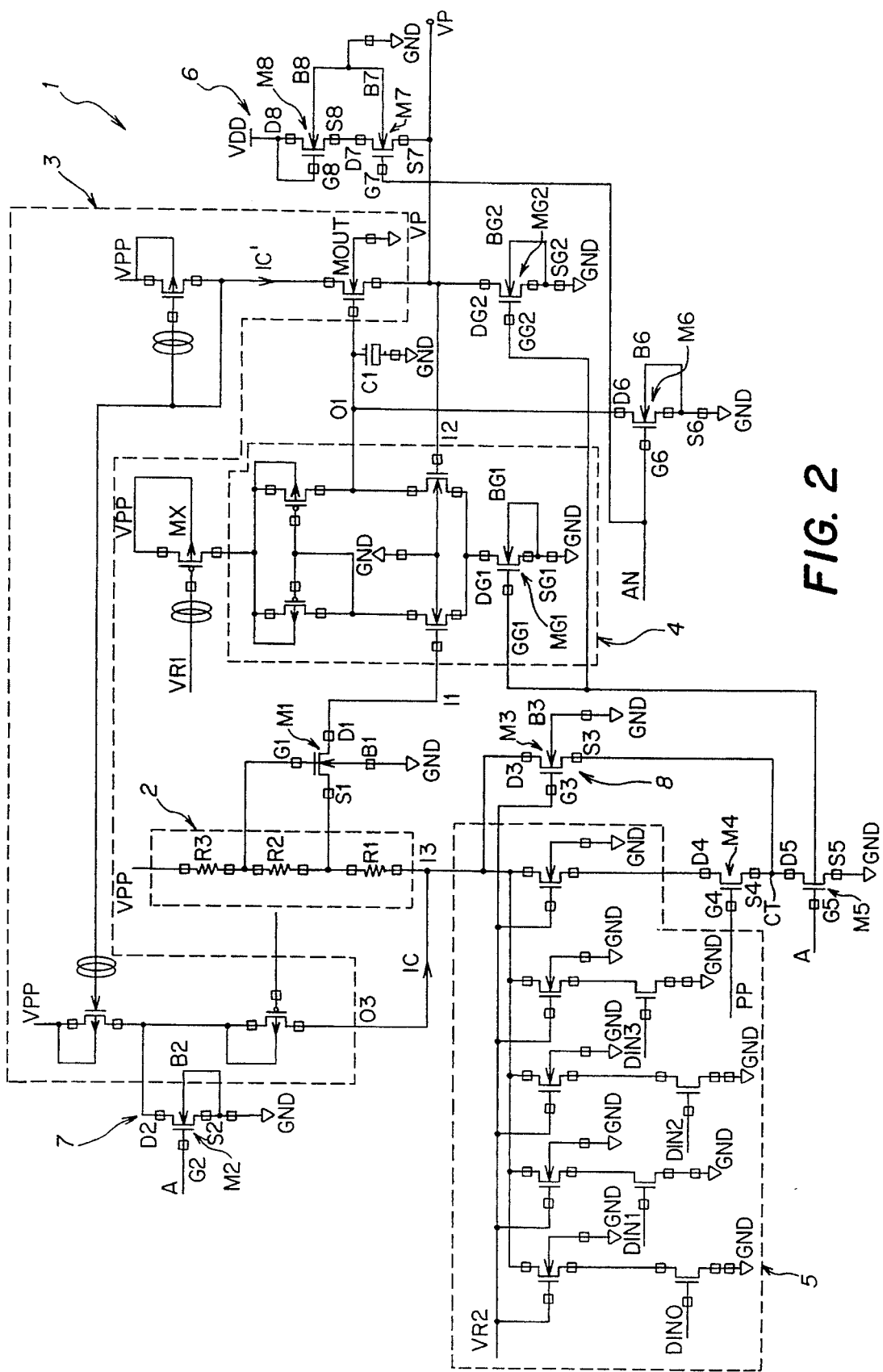
FIG. 2 shows diagramatically a regulator according to the invention.

With reference to FIG. 2, generally and schematically shown at 1 is the circuit architecture of a voltage regulator according to the invention, which comprises an amplifier stage being powered between a first and a second voltage reference and having a first input terminal connected to a divider of said first reference voltage and an output terminal fed back to said input through a current mirror, and a source-follower transistor controlled by said output and connected to the cells through a programming line.

The regulator 1 comprises an amplifier stage 4 incorporating two MOS transistors of the n-channel type, with source terminals connected together and to the drain terminal DG1 of a MOS transistor MG1 which functions as a current generator. The drain terminals of the two MOS transistors are connected to the drain terminals of another two MOS transistors of the p-channel type, in a current mirror configuration.

The amplifier 4 is connected between a first or programming voltage reference VPP, through a further MOS transistor MX, and a second voltage reference, in essence a signal ground GND.

The gate terminal of the last-mentioned MOS transistor MX is applied a first reference voltage VR1, whereas the voltage reference GND is applied to the source terminal SG1 of the transistor MG1.

The input I1 of the stage 4 is connected to the drain terminal D1 of a MOS transistor M1, which has its body terminal B1 connected to the voltage reference GND and source S1 and gate G1 terminals connected across a resistive element R2.

The resistive element R2 is connected in a resistive divider, generally denoted by 2. Said divider 2 comprises a series of three resistive elements and is placed between the voltage reference VPP and the output terminal, O3, of a current mirror generally denoted by 3.

Said current mirror 3 comprises four MOS transistors, and allows a current IC to be carried over to the input I3 of the divider 2 which is proportional to the current IC' supplied to a transistor MOUT to be described.

A resistive path 7 is connected to the current mirror 3 which comprises a MOS transistor M2. This transistor M2 has its drain terminal D2 connected to the current mirror 3, its body B2 and source S2 terminals connected to the voltage reference GND, and its gate terminal G2 controlled by a signal A.

The point of interconnection between the resistive divider 2 and the output of the mirror 3, denoted by I3, is also connected to a network of compensation resistive elements, generally denoted by 5.

That network 5 consists of a set of MOS transistors which function as resistive elements and are selected on the basis of the bit pattern to be programmed in the memory word; basically, for each bit to be programmed there corresponds a different compensation transistor. For example, the plurality of non-volatile memory cells to be programmed may include a group of non-volatile memory cells to be programmed to a high state. In such an instance, the network 5 may compensate for the number of non-volatile memory ceils to be programmed to the high state. Thus, the programming voltage at each non-volatile memory cell to be programmed to the high state remains within the predetermined range despite variations in the number of non-volatile memory cells to be programmed to the high state.

Said network 5 is connected between the voltage reference GND and a second polarization signal VR2. Connected in parallel with the network 5 is a resistive path 8 comprising a MOS transistor M3 which has its gate terminal G3 connected to the reference VR2, its drain terminal D3 connected to the node I3, its body terminal B3 connected to the voltage reference GND, and its source terminal S3 connected to a point CT of a series of two MOS transistors M4 and M5.

The MOS transistors M4 and M5 are connected between the voltage reference GND and the network 5 of resistive elements, being controlled at their gate terminals G4 and G5, respectively, by a signal PP (Parallel Programming) and an enable signal A.

These transistors function substantially in lieu of the network 5 during the memory testing procedure.

The gate G5 of the transistor M5 is connected to the gate terminals GG1 and GG2 of the transistors MG1 and MG2, and receives the enable signal A.

The transistor MG2 is connected between the current mirror 3 and the voltage reference GND, and has its body BG2 and source SG2 terminals connected together.

The output O1 of the amplifier stage 4 is connected to ground through the drain terminal D6 of a further MOS transistor M6 which has its body B6 and source S6 terminals connected to the voltage reference GND. The gate terminal G6 of the MOS transistor M6 is applied a negative logic signal AN which allows the output O1 of the amplifier 4 to be connected to ground during the turn-off step.

This signal AN is expediently also applied to the gate terminal G7 of a MOS transistor M7, connected in series with another MOS transistor, M8.

These MOS transistors, M7 and M8, are included to a decoupling element, generally denoted by 6. In addition, they have their body terminals connected together and to the voltage reference GND; the source terminal S7 of transistor M7 is connected to the programming line VP.

The transistor M8, on the other hand, is configured as a diode, with its gate and source terminals connected together and to a further voltage reference VDD.

Figure 3:
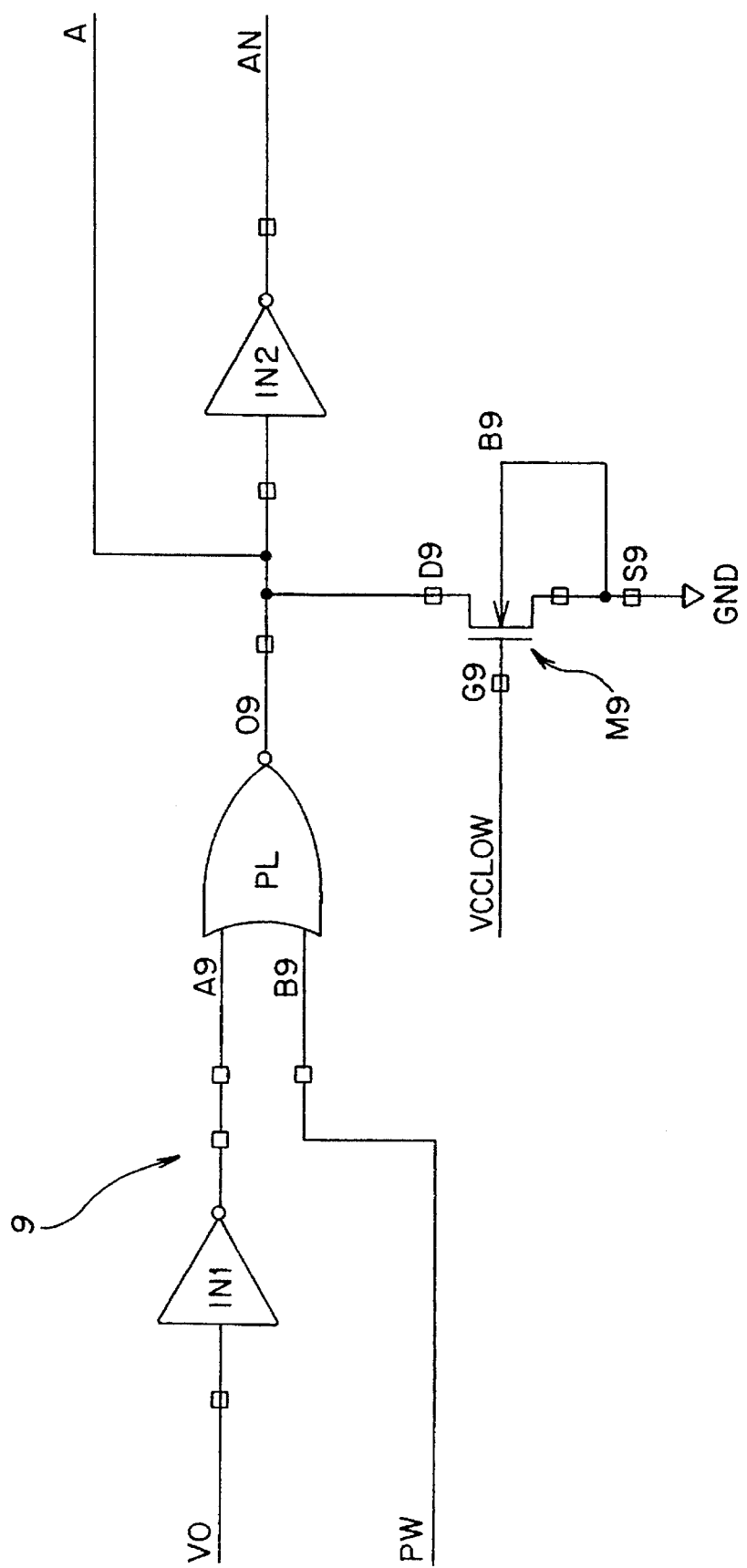
FIG. 3 shows schematically a circuit generating signals which appear in the regulator of FIG. 2.

The output O1 of the amplifier stage 4 is connected to ground via a parasitic capacitance C1 which ensures the amplifier stability. Further, the output O1 is connected to the source-follower transistor MOUT. The signals A and AN are generated by a circuit, generally shown at 9 in FIG. 3. This circuit 9 comprises a logic gate PL of the NOR type having two inputs A9 and B9 and an output O9.

The inputs A9 and B9 are applied the external signals VO and PW, with the former being brought to negative logic by means of an inverter IN1.

The output O9 is connected to the source terminal of a MOS transistor M9 whose gate terminal G9 is applied the external signal VCCLOW. This signal reveals dangerous drops in the supply voltage to the circuit.

The body B9 and source S9 terminals of that transistor M9 are connected to the voltage reference GND.

The output O9 supplies the signal A and signal AN, the latter being obtained from A by means of an inverter IN2. Thus, these signals can enable the on and off states of the regulator 1.

The operation of the voltage regulating circuit of this invention will now be discussed.

The current mirror 3 allows the compensation to be effected of the voltage drop caused by the series resistance of a bit line for which programming is sought. Said compensation is provided by adding, to the desired reference voltage as obtained through the resistive divider 2 from the voltage reference VPP, a voltage which varies according to the current draw by the cell or cells being programmed.

The provision of the transistor MG2, as necessary to maintain a resistive path from VP to ground, brings about an undesired voltage offset component.

The circuit arrangement of this invention overcomes this problem by the inclusion of the transistor M2, which will subtract a fraction of the bias current from the mirrored current. Said fraction is determined by the W/L ratio of the transistors provided in the current mirror 3.

This allows any offset voltage present on the programming line to be carried over to the input and compensated.

Furthermore, to improve the regulation linearity as the number of the programmed cells varies, this arrangement provides for the connection of a permanent resistive path 8 in parallel with the resistive elements selected in the network 5, through the transistor M3.

Finally, the decoupling element 6, comprising the series of the transistors M7 and M8, can bias, upon the regulator being turned off, the programming voltage VP to a value equal to the supply voltage VDD minus the value of the threshold voltage VT of one, M8, of the transistors, thereby causing the selection p-channel MOS transistors to be held in a cutoff state while the memory cells of the bit line are being read. In this way, the capacitance of the bit line will increase not even during the reading step on account of the connection to VP, and the reading process will not be slowed down.

Through such innovations, the voltage regulating circuit 1 of this invention overcomes the drawbacks with which the prior art is beset, and improves both the stability and reliability of a non-volatile memory programming and the speed of operation of the memory matrix in the read mode.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage regulator for programming a plurality of non-volatile memory cells, comprising:

a current mirror having an input and an output;

a resistive divider having a first input coupled to a first reference voltage, a second input coupled to the output of the current mirror, and an output;

an amplifier stage having an input coupled to the output of the resistive divider and an output coupled to the input of the current mirror;

a source-follower transistor controlled by said amplifier stage output and coupled to the plurality of non-volatile memory cells through a programming line, the source-follower transistor being further coupled to the input of the current mirror;

a first transistor that couples the programming line to a second reference voltage; and a resistive path coupled to the output of the current mirror and the second reference voltage.

2. The voltage regulator of claim 1, wherein said resistive path comprises a second transistor.

3. The voltage regulator of claim 2, wherein the second transistor has a drain terminal connected to the output of the current mirror and a source terminal connected to the second reference voltage.

4. The voltage regulator of claim 1, for programming a plurality of non-volatile memory cells with a pattern of bits to be stored in the plurality of non-volatile memory cells, the voltage regulator further comprising:

a network of resistive elements activated according to the pattern of bits, the network of resistive elements being connected between the resistive divider and the second voltage reference; and a resistive path connected in parallel with the network of resistive elements.

5. The voltage regulator of claim 4, further comprising a decoupling element, connected between a third reference voltage and the programming line, that disconnects the voltage regulator from the programming line when the plurality of non-volatile memory cells are read.

6. The voltage regulator of claim 1, further comprising a decoupling element, connected between a third reference voltage and the programming line, that disconnects the voltage regulator from the programming line when the plurality of non-volatile memory cells are read.

7. A voltage regulator for programming a plurality of non-volatile memory cells with a pattern of bits to be stored in the plurality of non-volatile memory cells, the voltage regulator comprising:

a current mirror having an input and an output;

a resistive divider having a first input coupled to a first reference voltage, a second input coupled to the output of the current mirror, and an output;

an amplifier stage having an input coupled to the output of the resistive divider and an output coupled to the input of the current mirror;

a source-follower transistor controlled by said amplifier stage output and coupled to the plurality of non-volatile memory cells through a programming line, the source-follower transistor being further coupled to the input of the current mirror;

a network of resistive elements activated according the pattern of bits, the network of resistive elements being connected between the resistive divider and a second voltage reference; and a resistive path connected in parallel with the network of resistive elements.

8. The voltage regulator of claim 7, wherein said resistive path includes a MOS transistor with a drain terminal connected to the second input of the resistive divider and a source terminal coupled to the second voltage reference.

9. The voltage regulator of claim 7, wherein the network of resistive elements comprises a plurality of transistors, and wherein the resistive path comprises a transistor.

10. The voltage regulator of claim 7, further comprising a decoupling element, connected between a third reference voltage and the programming line, that disconnects the voltage regulator from the programming line when the plurality of non-volatile memory cells are read.

11. A voltage regulator for programming a plurality of non-volatile memory cells, comprising:

a current mirror having an input and an output;

a resistive divider having a first input coupled to a first reference voltage, a second input coupled to the output of the current mirror, and an output;

an amplifier stage having an input coupled to the output of the resistive divider and an output coupled to the input of the current mirror;

a source-follower transistor controlled by said amplifier stage output and coupled to the plurality of non-volatile memory cells through a programming line, the source-follower transistor being further coupled to the input of the current mirror; and a decoupling element, connected between a third reference voltage and the programming line, that disconnects the voltage regulator from the programming line when the plurality of non-volatile memory cells are read.

12. The voltage regulator of claim 11, wherein said decoupling element comprises at least two transistors connected serially between the third reference voltage and the programming line.

13. The voltage regulator of claim 11, wherein each of the at least two transistors of the decoupling element has a body terminal, and wherein the body terminals of the at least two transistors are connected together and to the third reference voltage.

14. The voltage regulator of claim 11, wherein one of the at least two transistors of the decoupling element is configured as a diode.

15. The voltage regulator of claim 11, further comprising a disabling transistor, coupled to the output of the amplifier stage and the second reference voltage, that disables the amplifier when the plurality of non-volatile memory cells are read.

16. A voltage regulator for generating a programming voltage for a plurality of non-volatile memory cells, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier, the transistor having a bias current; and means for compensating for the bias current so that the programming voltage at the plurality of non-volatile memory cells remains within a predetermined range.

17. The voltage regulator of claim 16, wherein the plurality of non-volatile memory cells is to be programmed with patterns of bits to be stored in the plurality of non-volatile memory cells, the plurality of non-volatile memory cells including a group of non-volatile memory cells to be programmed to a high state for each pattern of bits, and wherein the voltage regulator further comprises means for compensating for a number of non-volatile memory cells to be programmed to the high state for each pattern of bits so that the programming voltage at each non-volatile memory cell to be programmed to the high state remains within the predetermined range despite variations in the number of non-volatile memory cells to be programmed to the high state.

18. The voltage regulator of claim 17, further comprising means for decoupling the output of the transistor from the plurality of non-volatile memory cells when the plurality of non-volatile memory cells are read.

19. The voltage regulator of claim 16, further comprising means for decoupling the output of the transistor from the plurality of non-volatile memory cells when the plurality of non-volatile memory cells are read.

20. A voltage regulator for generating a programming voltage for a plurality of non-volatile memory cells to be programmed with patterns of bits to be stored in the plurality of non-volatile memory cells, the plurality of non-volatile memory cells including a group of non-volatile memory cells to be programmed to a high state for each pattern of bits, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier; and means for compensating for a number of non-volatile memory cells to be programmed to the high state for each pattern of bits so that the programming voltage at each non-volatile memory cell to be programmed to the high state remains within a predetermined range despite variations in the number of non-volatile memory cells to be programmed to the high state.

21. The voltage regulator of claim 20, further comprising means for decoupling the output of the transistor from the plurality of non-volatile memory cells when the plurality of non-volatile memory cells are read.

22. A voltage regulator for generating a programming voltage for a plurality of non-volatile memory cells, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier; and means for decoupling the output of the transistor from the plurality of non-volatile memory cells when the plurality of non-volatile memory cells are read.

23. The voltage regulator of claim 22, wherein the means for decoupling includes means for causing the programming voltage to be a value equal to a supply voltage minus a threshold voltage of a decoupling transistor.

24. The voltage regulator of claim 22, wherein the means for decoupling includes means, coupled between a second voltage reference and the output of the transistor, for connecting the output of the transistor to the second voltage reference.

25. A voltage regulator for generating a programming voltage for a plurality of non-volatile memory cells, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier, the transistor having a bias current; and a current mirror having an input coupled to the transistor, and an output coupled to the first input of the amplifier, the current mirror compensating for the bias current of the transistor so that the programming voltage at the plurality of non-volatile memory cells remains within a predetermined range.

26. The voltage regulator of claim 25, wherein the plurality of non-volatile memory cells is to be programmed with patterns of bits to be stored in the plurality of non-volatile memory cells, the plurality of non-volatile memory cells including a group of non-volatile memory cells to be programmed to a high state for each pattern of bits, the voltage regulator further comprising a resistive path, coupled between the second input of the amplifier and a second reference voltage, that compensates for a number of non-volatile memory cells to be programmed to the high state for each pattern of bits so that the programming voltage at each non-volatile memory cell to be programmed to the high state remains within the predetermined range despite variations in the number of non-volatile memory cells to be programmed to the high state.

27. The voltage regulator of claim 25, further comprising at least one transistor, coupled between the output of the transistor and a third reference voltage, that decouples the output of the transistor from the non-volatile memory cells when the plurality of non-volatile memory cells are read.

28. The voltage regulator of claim 25, further comprising at least one transistor, coupled between the output of the transistor and a second reference voltage, that decouples the output of the transistor from the non-volatile memory cells when the plurality of non-volatile memory cells are read.

29. A voltage regulator for generating a programming voltage for a plurality of non-volatile memory cells to be programmed with patterns of bits to be stored in the plurality of non-volatile memory cells, the plurality of non-volatile memory cells including a group of non-volatile memory cells to be programmed to a high state for each pattern of bits, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier; and a compensation resistive element, coupled between the first input of the amplifier and a second reference voltage, that compensates for a number of non-volatile memory cells to be programmed to the high state for each pattern of bits so that the programming voltage at each non-volatile memory cell to be programmed to the high state remains within a predetermined range despite variations in the number of non-volatile memory cells to be programmed to the high state.

30. The voltage regulator of claim 29, further comprising at least one transistor, coupled between the output of the transistor and a third reference voltage, that decouples the output of the transistor from the non-volatile memory cells when the plurality of non-volatile memory cells are read.

31. A voltage regulator for generating a programming voltage for a plurality of non-volatile memory cells, the voltage regulator comprising:

an amplifier having a first input coupled to a reference voltage, a second input, and an output;

a transistor having an input coupled to the output of the amplifier, and an output that generates the programming voltage, the output of the transistor being coupled to the plurality of non-volatile memory cells and the second input of the amplifier; and a decoupling element, coupled between the output of the transistor and a second reference voltage, that decouples the output of the transistor from the non-volatile memory cells when the plurality of non-volatile memory cells are read.

32. The voltage regulator of claim 31, wherein the decoupling element includes at least one decoupling transistor coupled between the output of the transistor and the second reference voltage.

33. The voltage regulator of claim 31, wherein the decoupling element includes:

a first decoupling transistor having a first terminal coupled to the second reference voltage, a second terminal, and a gate terminal coupled to the second reference voltage; and a second decoupling transistor, having a first terminal coupled to the second terminal of the first decoupling transistor, and a second terminal coupled to the output of the transistor.

34. A memory device, comprising:

a plurality of memory cells; and a voltage regulator, coupled to the plurality of memory cells, that provides a programming voltage for the plurality of memory cells, the voltage regulator including;

an amplifier having a first input coupled to a reference voltage, a second input, and an output;

a transistor having an input coupled to the output of the amplifier, and an output that generates the programming voltage, the output of the transistor being coupled to the plurality of memory cells and the second input of the amplifier, the transistor having a bias current; and a current mirror having an input coupled to the transistor, and an output coupled to the second input of the amplifier, the current mirror compensating for the bias current of the transistor so that the programming voltage at the plurality of memory cells remains within a predetermined range.

35. The memory device of claim 30, wherein the plurality of memory cells is to be programmed with patterns of bits to be stored in the plurality of memory cells, the plurality of memory cells including a group of memory cells to be programmed to a high state for each pattern of bits, the voltage regulator further comprising a resistive path, coupled between the second input of the amplifier and a second reference voltage, that compensates for a number of memory cells to be programmed to the high state for each pattern of bits so that the programming voltage at each memory cell to be programmed to the high state remains within the predetermined range despite variations in the number of memory cells to be programmed to the high state.

36. The memory device of claim 35, wherein the voltage regulator further includes at least one transistor, coupled between the output of the transistor and a third reference voltage, that decouples the output of the transistor from the plurality of memory cells when the plurality of memory cells are read.

37. The memory device of claim 34, wherein the voltage regulator further includes at least one transistor, coupled between the output of the transistor and a third reference voltage, that decouples the output of the transistor from the plurality of memory cells when the plurality of memory cells are read.

38. A memory device, comprising:

a plurality of memory cells; and a voltage regulator, coupled to the plurality of memory cells, that provides a programming voltage for the plurality of memory cells, the plurality of memory cells to be programmed with patterns of bits to be stored in the plurality of memory cells, the plurality of memory cells including a group of memory cells to be programmed to a high state for each pattern of bits, and wherein the voltage regulator includes;

an amplifier having a first input coupled to a reference voltage, a second input, and an output;

a transistor, with an input coupled to the output of the amplifier, and an output that generates the programming voltage, the output of the transistor being coupled to plurality of memory cells and the second input of the amplifier; and a compensation element, coupled between the first input of the amplifier and a second reference voltage, that compensates for a number of memory cells to be programmed to the high state for each pattern of bits so that the programming voltage at each memory cell to be programmed to the high state remains within a predetermined range despite variations in the number of memory cells to be programmed to the high state.

39. The memory device of claim 38, wherein the voltage regulator further includes at least one transistor, coupled between the output of the transistor and a third reference voltage, that decouples the output of the transistor from the plurality of memory cells when the plurality of memory cells are read.

40. A memory device, comprising:

a plurality of memory cells; and a voltage regulator, coupled to the plurality of memory cells, that provides a programming voltage for the plurality of memory cells, the voltage regulator including;

an amplifier having a first input coupled to a reference voltage, a second input, and an output;

a transistor having an input coupled to the output of the amplifier, and an output that generates the programming voltage, the output of the transistor being coupled to the plurality of memory cells and the second input of the amplifier; and a decoupling element, coupled between the output of the transistor and a second reference voltage, that decouples the output of the transistor from the plurality of memory cells when the plurality of memory cells are read.

41. The memory device of claim 40, wherein the decoupling element includes at least one decoupling transistor coupled between the output of the transistor and the second reference voltage.

42. The memory device of claim 40, wherein the decoupling element includes:

a first decoupling transistor having a first terminal coupled to the second reference voltage, a second terminal and a gate terminal coupled to the second reference voltage; and a second decoupling transistor, having a first terminal coupled to the second terminal of the first decoupling transistor, and a second terminal coupled to the output of the transistor.

* * * * *